United States Patent [19]

Fischer

[11] 3,796,921

[45] Mar. 12, 1974

[54] LEAD SUPPORTING HOUSING FOR ELECTRICAL COMPONENT

[76] Inventor: Artur Fischer, Altheimer Str. 219, D-7241 Tumlingen, Germany

[22] Filed: June 14, 1973

[21] Appl. No.: 370,060

[30] Foreign Application Priority Data

June 30, 1972 Germany ........................... 2232013

[52] U.S. Cl. .................. 317/99, 339/17 CF, 29/626, 317/101 CC, 174/DIG. 3

[51] Int. Cl. ............................................... H01r 9/02

[58] Field of Search ......... 317/99, 101 CC, 101 CE, 317/101 F, 118, 120; 174/DIG. 3; 29/626; 339/17 C, 17 CF, 17 N, 221 R

[56] References Cited

UNITED STATES PATENTS

| | | | |
|---|---|---|---|
| 3,735,214 | 5/1973 | Renskers | 174/DIG. 3 |
| 3,184,699 | 5/1965 | Spera | 339/17 CF |

FOREIGN PATENTS OR APPLICATIONS

| | | | |
|---|---|---|---|
| 1,152,765 | 5/1969 | Great Britain | 339/17 CF |

*Primary Examiner*—James R. Scott
*Assistant Examiner*—Gerald P. Tolin
*Attorney, Agent, or Firm*—Michael S. Striker

[57] ABSTRACT

One or more electrically energized electric circuit components are provided each having two leads. One or more plug-in carrier module is provided having a body portion provided on one side with a recess dimensioned to accommodate the respective circuit component, and provided on the other side with two parallel projecting pins which are integral with the body portion and each provided on their outer, inner and free end faces with a continuous groove into which one of the leads of the circuit component can be inserted, so that when these pins are inserted into recesses of a circuit bore, the leads may contact with the same.

5 Claims, 3 Drawing Figures

LEAD SUPPORTING HOUSING FOR ELECTRICAL COMPONENT

BACKGROUND OF THE INVENTION

The present invention relates generally to a set for assembling electrical circuits, and more particularly to a set for assembling plug-in electrical circuits.

There are many circumstances where it is desirable to be able to quickly produce and modify an electrical circuit, for instance for test purposes, for experimental purposes and the like. Such requirements exist, inter alia, in toy kits which are intended to teach the playing child electrical and/or electronic fundamentals.

It is already known to provide such sets with circuit boards having holes or recesses wherein electrical connections are exposed at the inner surface of the respective recess. Plug-in modules are provided having pins which can be inserted into these recesses. The modules are usually made of synthetic plastic material which can be readily cast in an injection molding machine. However, the pins are of metallic material to be electrically conductive and are provided with threaded portions which are threaded into tapped bores formed in the synthetic plastic body of the module. Thus, although the body itself can be produced rapidly and inexpensively by injection molding, it is necessary subsequently to form tapped bores into which the pins can be threaded. Of course, in addition, it is necessary to produce the pins themselves which is a relatively expensive undertaking because they must not only be shaped but also must be provided with screw threads. Also, they must be properly dimensioned so that they will fit into the recesses of the circuit board. Finally, the pins are longitudinally slotted over part of their length, in order to permit elastic deformation of the two sections which are thus formed in each pin, thereby to provide for a better retention of the pin in the recess of the circuit board and to facilitate better electrical connection. An electrical or electronic circuit component, for instance a resistor or the like, is arranged between the pins and its leads which are usually wire, are bent to form rings or eyes which are slipped over the respective pins where they may be secured by means of nuts or the like. Once this is done, the module is ready for use.

It will be appreciated, however, that this is an expensive way of producing such a module because of the many operating steps involved in manufacturing it, and the attendant labor expenses which are incurred as a result thereof. Although such plug-in modules are very versatile and easy to handle, and although in the context of electrical or electronic sets for teaching electrical or electronic fundamentals to children they have high value as a teaching aid, such modules have nevertheless not found wide use because of the expense involved in producing them.

SUMMARY OF THE INVENTION

It is, accordingly, a general object of the invention to overcome the disadvantages of the prior art.

More particularly, it is an object of the present invention to provide an improved set for assembling plug-in electrical circuits which is not possessed of these disadvantages.

Still more particularly, it is an object of the present invention to provide such an improved set wherein the plug-in modules can be produced readily and inexpensively.

A concomitant object of the invention is to provide such a set wherein the plug-in modules will meet all requirements made of them in terms of proper contacting with other components upon the plug-in operation, despite their inexpensive construction.

In keeping with these objects and with others which will become apparent hereafter, one feature of the invention resides in a set for assembling plug-in electrical circuits, wherein there is provided a combination comprising at least one electrically energized circuit component having two leads, and at least one plug-in carrier module comprising a body portion having one side and an other side which is arranged to support from the one side integral therewith and in mutual parallelism. Each of these pins has an outer and an inner longitudinally extending face and a free end face all of which are provided with a continuous groove into which a respective one of the leads is inserted so as to extend along the outer, inner and end faces. Thereupon the pins of the module are inserted into recesses of a circuit board for the leads to make contact with the same.

By resorting to the present invention, the carrier module can in its entirety be produced by injection molding in a single operation. The grooves formed in the pins can of course be produced during the molding and the pins are of one piece with the body portion and are thus also produced during the single molding operation. Given a sufficiently large series of such modules to be produced, the expenses of making them — and consequently the selling expenses — are dictated essentially only by the price of the synthetic plastic material, and the labor costs involved are negligible. The finished module including the electrical circuit component will thus having a selling price which can be calculated by combining the price of the material for the carrier module and the price of the electrical and electronic component, but which does not include the negligible labor expenses.

When the carrier module is to be provided with the electrical or electronic component, for instance a resistor, the component is provided on the aforementioned other side of the body portion, where there will advantageously be formed a depression dimensioned to accommodate this component. The wire leads of the component are placed around opposite ends of the main portion and into the groove extending along the outside of each pin. They are then bent around the free end face of the pin and extend along the inside of the same pin in the groove thereon. This connects the circuit component with the carrier module and on the other hand, particularly those portions which are located at the inside face of the respective pin and which tend to flex somewhat away from the pin, provide for proper contacting with the electrical contacts of a circuit board into the recesses of which the pins are inserted. A particular advantage of the present invention is the fact that if and when it is necessary or desired to do so, the electrical circuit component can readily be exchanged for another one at any time.

The spring action of the bent-over portion of the leads located at the inner side of the respective pin always assures a reliable electrical contact between the recesses of a circuit board. This is particularly important for electronic circuits. This spring action can be further enhanced if, in accordance with another concept of the invention, the end faces of the pins are rounded or are inclined in the direction towards the inner face of the respective pin.

Still another advantageous concept of the invention provides for that surface of the body portion from which the pins project, to be formed with two pocket-like recesses, and for two leaf springs to be provided each having a portion received in one of the recesses and another portion extending along the inside face of the respective pin intermediate this face and the associated portion of a lead of an electrical component. The portion extending along the inside face may be provided with a concave configuration so as to provide proper spring action and will still more reliably urge the overlying part of a respective wire lead into contact with electrical contacts provided in recesses of a circuit board into which a pin is inserted.

The depression in which the electrical or electronic component can be located could be omitted if desired. It is, however, advantageous to provide it because it not only assures proper positioning and retention of the circuit component but also protection for the same when the module is plug-in or removed from a circuit board. In addition, when the circuit component is so retained this facilitates the bending of the leads thereof around the pins.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
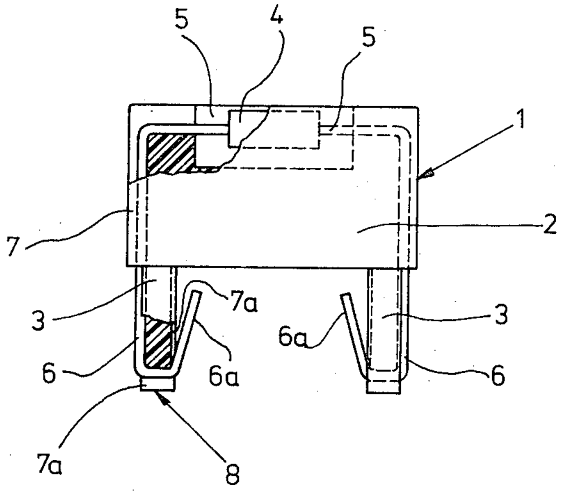
FIG. 1 is a partly sectioned side view illustrating one embodiment of the invention.
Figure 2:
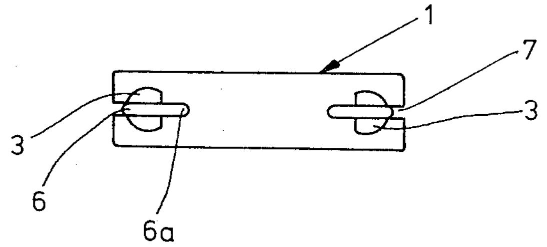
FIG. 2 is a bottom plane view of FIG. 1.

Discussing now the drawing in detail, and firstly the embodiment which is illustrated in FIGS. 1 and 2, it will be seen that the carrier module in this embodiment is designated with reference numeral 1. It has a body portion 2 on one side of which there are formed two parallel pins 3 which are to be inserted into recesses 12 (see FIG. 3) of a circuit board 11 wherein electrical contact sleeves 13 or similar means are provided for establishing an electrical contact. Such circuit boards are known and require no further detailed description.

An electrical or electronic circuit component 4 is provided, for instance a resistor which is accommodated in a depression 5 formed in that side of the body 2 which faces away from the pins 3. The component 4 has wire leads 6 which are bent around the opposite end faces of the body 2 and accommodated in grooves 7 formed in these end faces. From these grooves 7 the wire leads 6 continue into a continuous groove 7*a* formed in the respective pins 3 and each extending longitudinally of the pin 3 along the outer face thereof, around the free end face thereof, and along the inner face of the same pin. The end face is identified with reference numeral 8 and the free end portions of the leads 6 which are located at the inner sides of the respective pins 3 are identified with reference numeral 6*a* and will be seen to have a slight spring action so that they extend away from this inner end face.

Evidently, when these pins are inserted into the recesses 12 of a circuit board 11, the spring action of the end portions 6*a* will cause the same to press firmly against the electrically sleeves 13 so that a reliable connection in electrical sense is established therewith. At the same time, the substantially U-shaped bending of the leads 6 around the pins 3 assures a proper and adequate retention of the electrical or electronic circuit component 4 on the module 1.

Figure 3:
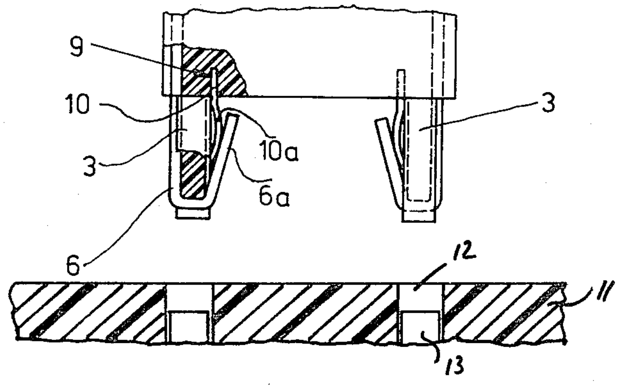
FIG. 3 is a view similar to FIG. 1 illustrating a somewhat different embodiment and also showing a part of a circuit board.

Coming to the embodiment of FIG. 3 it will be seen that this resembles the one in FIGS. 1 and 2 except that the side of the portion 2 which is provided with the projecting pins 3 also has pocket-like recesses 9. Leaf springs 10 are provided each having a portion received in one of these recesses 9 and having a further portion 10*a* which extends along the inner face of the respective pin 3 intermediate this inner face and the end portion 6*a* of the respective lead 6. They are provided with an outwardly convex shape, such as a bulge, to enhance the spring action so that when the pins are inserted into the recesses 12 of the circuit board 11, these portions 6*a* will be still more firmly and reliably pressed against the contact sleeves 13. By appropriately selecting the material of the springs 10, which need not be metallic because the springs 10 do not have to be conductive so that they could for instance also be made of synthetic plastic material, a decrease of the springiness can be prevented even over a long period of use.

It will be understood that each of the elements described above, or two or more together, may also find a useful application in other types of constructions, differing from the types described above.

While the invention has been illustrated and described as embodied in a set for assembling plug-in electrical circuits, it is not intended to be limited to the details shown, since various modifications and structural changes may be made without departing in any way from the spirit of the present invention.

Without further analysis, the foregoing will so fully reveal the gist of the present invention that others can, by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims:

1. In a set for assembling plug-in electrical circuits, a combination comprising at least one electrically energized circuit component having two leads; and at least one plug-in carrier module comprising a body portion having one side and an other side supporting said component, and a pair of pins projecting from said one side integral therewith and in mutual parallelism, said pins each having an outer and inner longitudinally extending face and a free end face all of which are provided with a continuous groove into which a respective one of said leads is inserted and extends along the respective outer, end and inner faces, whereupon said pins of said module are insertable into recesses of a circuit board for said leads to make contact with the same.

2. A combination as defined in claim 1, wherein said other side has a recess for accommodation of said component therein.

3. A combination as defined in claim 1; further comprising a pair of leaf springs, each mounted on said body portion and extending along said inner face of a respective one of said pins so as to be located between said inner face and the associated lead.

4. A combination as defined in claim 3, wherein said one side is provided with two pocket-shaped recesses, and wherein each of said leaf springs includes a portion received in one of said recesses.

5. A combination as defined in claim 1, wherein said module is of synthetic plastic material.

* * * * *